United States Patent [19]

Schwalm et al.

[11] Patent Number: 4,822,866

[45] Date of Patent: Apr. 18, 1989

[54] COPOLYMERS HAVING O-NITROCARBINOL ESTER GROUPS AND PRODUCTION OF SEMICONDUCTOR COMPONENTS

[75] Inventors: Reinhold Schwalm, Wachenheim; Horst Binder, Lampertheim, both of Fed. Rep. of Germany

[73] Assignee: BASF Aktiengesellschaft, Fed. Rep. of Germany

[21] Appl. No.: 142,930

[22] Filed: Jan. 12, 1988

[51] Int. Cl.$^4$ .................................................. G03C 1/70
[52] U.S. Cl. ...................................... 526/311; 430/270; 430/326; 526/263
[58] Field of Search ................. 430/270, 326; 526/311

[56] References Cited

U.S. PATENT DOCUMENTS

| | | | |
|---|---|---|---|
| 3,926,636 | 12/1975 | Barzynski | 96/115 R |
| 4,389,482 | 6/1983 | Bargon et al. | |
| 4,456,679 | 6/1984 | Leyrer | 430/326 |
| 4,465,760 | 8/1984 | Leyrer | 430/325 |
| 4,565,771 | 1/1986 | Lynch | 430/307 |
| 4,576,902 | 3/1986 | Saenger | 430/326 |
| 4,579,806 | 4/1986 | Schupp | 430/280 |
| 4,596,759 | 6/1986 | Schupp | 430/271 |
| 4,632,900 | 12/1986 | Demmer | 430/323 |

OTHER PUBLICATIONS

State of Art of Acrylate Resists: An Overflow of Polymer Structure and Lithographic Performance-Moreau-Optical Engineering/Mar./Apr. 1983, vol. 22, No. 2-pp. 181-184.
Structural Composition of Polymers Relative to Their Plasma Etch Characteristics-Pederson-J. Electrochem.Soc:Solid-State Science and Technology-Jan. 1982, pp. 205-208.
Dry Etching Durability of Positive Electron Resists-Harada-Journal of Applied Polymer Science, vol. 26, pp. 3395-3408-1981.
Mathematical Modeling of the Lithium-Aluminum, Iron Sulfide Battery Pollard & Newman-Journal of the Electrochemical Society, vol. 128, No. 3, Mar. 1981-pp. 491-502.
Effect of Composition on Resist Dry-Etching Susceptibility-Helbert & Schmidt Polymer Materials for Electronic Applications-pp. 61-72.
Effect of Composition on Resist Dry Etching Susceptibility-Herbert, Schmidt & Malkiewicz-Polymers in Electronics-pp. 91-100.

*Primary Examiner*—Paul R. Michl
*Assistant Examiner*—Susan E. S. McBee
*Attorney, Agent, or Firm*—Keil & Weinkauf

[57] ABSTRACT

Copolymers containing from 5 to 50 mol % of monomers having o-nitrocarbinol ester groups, from 94 to 30 mol % of methacrylonitrile, from 1 to 20 mol % of olefinically unsaturated copolymerizable carboxylic acid and from 0 to 30 mol % of other copolymerizable monomers as copolymerized units are useful for fabricating semiconductor components.

11 Claims, No Drawings

COPOLYMERS HAVING O-NITROCARBINOL ESTER GROUPS AND PRODUCTION OF SEMICONDUCTOR COMPONENTS

The present invention relates to a copolymer having o-nitrocarbinol ester groups, to a method of using it as a light-sensitive coating material for photoresists, and to a process for producing semiconductor components wherein a light-sensitive material is subjected to imagewise irradiation with UV light within the region from 190 nm to 300 nm, the pattern is developed and transferred by means of a plasma into the substrate underneath, and fabrication of the component is completed.

Positive-working acrylate resists for use in photolithographic processes for producing semiconductor components are known. These materials are predominantly poly(methyl methacrylate) derivatives which, after exposure, become soluble in organic solvents in which they were insoluble before exposure. A survey of acrylate resists is given by W. Moreau, "State of the art of acrylate resists: an overview of polymer structure and lithographic performance" in Optical Engineering, 22(2) (1983), 181–184.

Light-sensitive coating materials which contain o-nitrocarbinol ester groups and can be washed out with alkaline solvents are described for example in DE-A-2,150,691 and DE-A-2,922,746.

Although these existing coating materials which are suitable for the production of resist coatings are generally sufficiently stable to strong and aggressive acids and alkalis as used for example in etching baths, their stability is limited in fluorine- and chlorine-containing plasmas as used for etching in semiconductor component fabrication, and in need of improvement. In addition, the heat stability of these coating materials after exposure and development is insufficient for these applications, since the strength of the resist coatings produced therefrom decreases substantially above 50° C.

The plasma stability of polymethyl methacrylate (=PMMA) and derivatives thereof is about 2 to 5 times less than that of commercial novolak resists (L. Pederson in J. Electrochem. Soc. 129 (1982), 206; K. Harada, J. Appl. Pol. Sci. 26 (1981), 3395; K. Harada, J. Electrochem. Soc. 129 (1981), 491. Increased plasma stability of PMMA derivatives was obtained by introducing phenyl rings into the ester side groups or cyano groups (I. N. Helbert and M. A. Schmidt in Polymer Materials for Electronic Applications, Amer. Chem. Soc. Symp. Ser. 184, E. D. Feit and C. Wilkins, Jr. Es., Washington, DC, 1982, pp. 61–72 and J. N. Helbert, M. A. Schmidt, C. Malkiewicz, E. Wallace, Jr., and C. U. Pittman, Jr., in Polymers in Electronics, Am. Chem. Soc. Symp. Ser. 242, T. Davidson, Ed., Washington, DC, 1984, pp. 91–100).

It is true that these existing symtoms show improved plasma stability, but they can only be washed out in organic solvents.

U.S. Pat. No. 4,389,482 describes copolymers of methacrylonitrile and methacrylic acid which show improved etch stability in $CF_4$ plasmas compared with PMMA and can be washed out with aqueous ethanol; however, they require a further postbake step at above 140° C. prior to the plasma treatment.

It is an object of the present invention to provide a positive-working acrylate resist which in particular makes it possible to produce resist patterns, has a high thermostability and resistance to fluorine- and chlorine-containing plasmas and, after imagewise exposure to deep UV light ($\lambda = 190$ nm $-300$ nm), can be washed out with water or aqueous-alkaline solvents.

We have found that this object is achieved by starting from a copolymer which has been prepared from an o-nitrocarbinol ester of an unsaturated carboxylic acid, methacrylonitrile, with or without further comonomers, and which, after exposure, can be washed out with an aqueous-alkaline solvent. To obtain high thermostability, the monomers are advantageously selected in such a way that the glass transition temperature of the resulting copolymer is substantially above 100° C. It is further advantageous to select the acrylate monomers in such a way that the α-position is alkylated, thereby to prevent a crosslink reaction by α-hydrogen abstraction during exposure.

The present invention accordingly provides a copolymer which contains as copolymerized units (a) from 5 to 50 mol % of one or more compounds of the general formula (I)

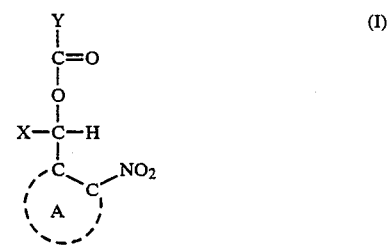

where
- A is an aromatic or heteroaromatic, substituted or unsubstituted ring system of 5 to 14 ring members,
- X is hydrogen, alkyl of 1 to 8 carbon atoms, or substituted or unsubstituted aryl or aralkyl, and
- Y is an ethylenically unsaturated radical of 2 to 6 carbon atoms, (b) from 94 to 30 mol % of methacrylonitrile,
(c) from 1 to 20 mol % of one or more olefinically unsaturated copolymerizable carboxylic acids of 3 to 6 carbon atoms,
(d) from 0 to 30 mol % of 1 or more further olefinically unsaturated, copolymerizable organic compounds other than (a), (b) and (c), whose homopolymers are transparent within the wavelength region from 250 to 400 nm, with the proviso that the percentages mentioned under (a) to (d) add up to 100.

Y in the general formula (I) is in particular one of the radicals

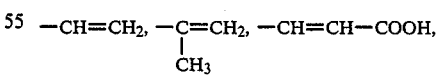

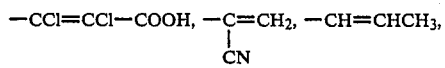

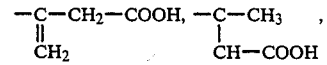

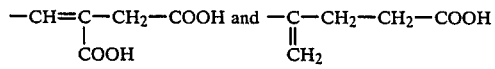

It is also preferable if in the general formula (I) the radical A is phenyl, the radical X is methyl and the radical Y is a

group and component (c) present as copolymerized units is methacrylic acid.

The present invention also provides in particular a process for fabricating semiconductor components using the copolymer according to the invention, wherein the copolymer is applied as a light-sensitive resist to a substrate and subjected to imagewise exposure with short-wave UV light and subsequently the exposed areas are washed out with an aqueous-alkaline solvent. Owing to its substantially improved plasma stability, the relief pattern produced can subsequently be transferred into the substrate by means of fluorine- or chlorine-containing plasmas and thereafter fabrication of the component be completed.

The copolymer according to the invention can also be used as a light-sensitive coating material for producing dry resists and as a resist.

The light-sensitive copolymer can be prepared by various existing methods of synthesis, in particular by free-radical copolymerization of monomers (a) to (d). It is also possible to employ transesterification reactions to introduce the aromatic o-nitrocarbinol groups, for example into copolymers of unsaturated carboxylic acids and methacrylonitrile.

In what follows, the components of which the copolymer according to the invention is composed will be discussed in detail.

(a) Suitable o-nitrocarbinol ester monomers of the general formula (I)

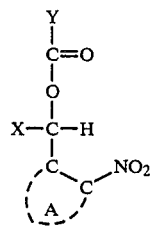

where A is an aromatic or heteroaromatic, substituted or unsubstituted ring system of 5 to 14 ring members, X is hydrogen, alkyl of 1 to 8 carbon atoms, or substituted or unsubstituted aryl or aralkyl, and Y is an ethylenically unsaturated radical of 2 to 6 carbon atoms, are for example those where the radical Y in the general formula (I) is one of the radicals

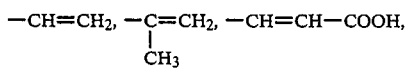

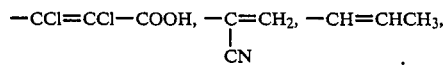

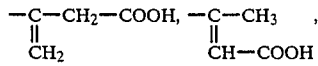

-continued

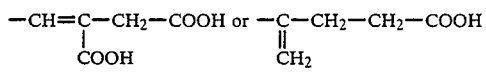

In this definition, an aromatic ring system A comprises in particular benzene or a substituted benzene. The benzene ring can be monosubstituted or polysubstituted, for example by $C_1-C_8$-alkyl, in particular methyl, by $C_1-C_6$-alkoxy, in particular methoxy, by halogen, such as chlorine or bromine, by nitro or amino, monomethylamino, dimethylamino, nitrilo, and by sulfo. Also possible are substituted and unsubstituted polynuclear aromatic ring systems, such as naphthalene, anthracene, anthraquinone and phenanthrene, and substituted derivatives thereof. A heteroaromatic ring system A is in particular pyridine. X is in particular hydrogen, methyl, ethyl or substituted or unsubstituted phenyl.

Particularly suitable aromatic and heteroaromatic o-nitrocarbinols from which to derive the o-nitrocarbinol ester groups have proven to be for example: o-nitrobenzyl, 6-nitroveratryl, 2-nitro-4-aminobenzyl, 2-nitro-4-dimethyl-aminobenzyl, 2-nitro-4-methylaminobenzyl, 2-nitro-5-dimethylaminobenzyl, 2-nitro-5-aminobenzyl, 2-nitro-4,6-dimethoxybenzyl, 2,4-dinitrobenzyl, 3-methyl-2,4-dinitrobenzyl, 2-nitro-4-methylbenzyl or 2,4,6-trinitrobenzyl alcohol, and also 2-nitrobenzhydrol, 2,2'-dinitrobenzhydrol, 2,4-dinitrobenzhydrol and 2,2',4,4'-tetranitrobenzhydrol. Similarly suitable are for example 2-nitro-3-hydroxymethylnaphthalene, 1-nitro-2-hydroxymethylnaphthalene and 1-nitro-2-hydroxymethylanthraquinone.

Examples of particularly preferred aromatic or heteroaromatic o-nitrocarbinols from which the o-nitrocarbinol ester groups of the general formula (I) are derivable are o-nitrobenzyl alcohol, 2-nitro-6-chlorobenzyl alcohol, 2-nitro-4-cyanobenzyl alcohol, 2-nitro-4,5-dimethoxybenzyl alcohol, α-methyl-o-nitrobenzyl alcohol, α-phenyl-o-nitrobenzyl alcohol, α-(o-nitrophenyl)-o-nitrobenzyl alcohol and 2-nitro-3-hydroxymethylpyridine.

The copolymer according to the invention is based as stated above on an o-nitrocarbinol ester of an olefinically unsaturated carboxylic acid as monomer, the ethylenically unsaturated mono- or dicarboxylic acid being for example acrylic acid, methacrylic acid, maleic acid, dichloromaleic acid, fumaric acid, crotonic acid, itaconic acid or methyleneglutaric acid. Preference is given to α-alkyl-substituted carboxylic acids, in particular metha-crylic acid.

The o-nitrocarbinol esters of olefinically unsaturated carboxylic acids can be prepared by known methods of organic chemistry, for example by reacting the acid chlorides with o-nitrocarbinols or by direct acid-catalyzed esterification.

Particularly preferred o-nitrocarbinol ester monomers are o-nitrobenzyl acrylate, o-nitrobenzyl methacrylate, o-nitro-α-methylbenzyl(meth)acrylate and 2-nitro-6-chloro-α-methylbenzyl(meth)acrylate.

The copolymer according to the invention contains o-nitrocarbinol ester monomers (a) in an amount from 5 to 50, preferably from 10 to 30, mol % as copolymerized units.

(b) Comonomers (b) present in the copolymer according to the invention comprise methacrylonitrile which is present as copolymerized units in the copolymer according to the invention in an amount from 94 to 30, preferably 89 to 50, mol %.

(c) Comonomers (c) present as copolymerized units in the copolymer according to the invention comprise one or more olefinically unsaturated copolymerizable carboxylic acids of 3 to 6 carbon atoms, e.g. acrylic acid, methacrylic acid, maleic acid or mixtures thereof. Preference is given to methacrylic acid.

The monomers (c) are present as copolymerized units in the copolymer according to the invention in amounts from 1 to 20 mol %.

(d) To improve the solubility in aqueous alkaline solvents or to obtain other properties, such as increased thermal stability, the copolymer according to the invention may also contain as copolymerized units one or more olefinically unsaturated copolymerizable organic compounds, other than (a), (b) and (c), whose homopolymers are transparent in the wavelength region from 250 to 400 nm.

Examples of suitable comonomers of this type are ethylenically unsaturated nitriles, such as acrylonitrile, malonitrile, fumaronitrile and/or crotononitrile, hydroxyalkyl(meth)acrylates, (un)substituted N-(meth)acrylamides, other ethylenically unsaturated compounds, such as ethylene, dienes, such as isoprene, butadiene, esters of the abovementioned olefinically unsaturated carboxylic acids, such as esters of acrylic and in particular methacrylic acid with $C_1$-$C_8$-alcohols and mixtures of these monomers, preferably methyl methacrylate.

The monomers (d) can be present as copolymerized units in the copolymer according to the invention in amounts from 0 to 30, preferably from 0 to 20, mol %.

The mole percentages of (a) to (d) in the copolymer according to the invention add up to 100.

Examples of particularly preferred copolymers according to the invention are those of o-nitro-α-methylbenzyl methacrylate, methacrylonitrile and methacrylic acid; o-nitrobenzyl methacrylate, methacrylonitrile and methacrylic acid; 2-nitro-6-chloro-α-methylbenzyl acrylate, methacrylonitrile and methacrylic acid; and o-nitro-α-methylbenzyl methacrylate, methacrylonitrile, methacrylic acid and hydroxyethyl methacrylate.

The copolymer according to the invention is preparable from the particular monomers by a conventional method of polymerization, for which the monomers are preferably chosen in such a way that the glass transition temperature of the resulting copolymer is above 100° C. To this end, the monomers can for example be heated for several hours at 60°–120° C. in a suitable solvent, such as ethyl acetate, toluene or acetone, together with a polymerization initiator, such as benzoyl peroxide or azobisisobutyronitrile. This reaction is advantageously conducted in such a way that the conversion is not substantially more than 50%, in order to obtain a very narrow molecular weight distribution.

The molecular weight can be determined by the polymerization conditions, such as reaction temperature, type of initiator and initiator concentration, and also type of solvent and monomer concentration. Initiator concentrations from 0.1 mol % to 5 mol % and monomer concentrations from 3% to 50% are preferred. The molecular weight and the molecular weight distribution have a substantial influence on the solubility in a particular developer. The lower the molecular weight and the narrower the molecular weight distribution, the better and the more uniform the developability.

The polymers obtained can advantageously be fractionated, in which case the high molecular weight fractions which show poor solution properties and the low molecular weight fractions which lead to increased stripping in the unexposed areas are discarded. The molecular weights of the fractions which are preferably used range from 20,000 to 200,000 and have narrower molecular weight distributions, preferably Mw/Mn<3.

The use of the copolymer according to the invention is not restricted to application as a photoresist for fabricating semiconductor components; it can also be used in light-sensitive coating materials such as dry resists and printing plates. For these applications, other ingredients such as dyes, pigments, sensitizers and other additives may be added to the light-sensitive materials.

In the practice of the process for producing semiconductor components, the light-sensitive polymer is advantageously dissolved in a suitable solvent (e.g. dimethylformamide, diethylene glycol dimethyl ether), the solution is filtered, and a layer from 0.5 to 1.5 μm is applied by spincoating to a semiconductor substrate (for example an oxidized silicon wafer). After baking at from 100° to 160° C. the light-sensitive resist is subjected to imagewise structuring by exposing the layer to light within the wavelength region from 190 nm to 300 nm, preferably 248 nm, through a superposed mask and is developed with an aqueous-alkaline solvent. For example, the exposed wafer is dipped into an alkaline solution, for example 3% strength aqueous triethanolamine, 1% strength sodium hydrogencarbonate or 0.2% strength tetramethylammonium hydroxide solution. Typical exposure times are within the range from 1 to 10 minutes, preferably 1 to 2 minutes, and should be only a little longer than the minimum time required, and the stripping in the unexposed areas should not amount to more than 10%. Thereafter the relief pattern obtained is transferred in a commercially available parallel plate reactor in a sulfur hexafluoride or tetrafluoromethane-oxygen plasma into the silicon or silicon dioxide layer underneath. Thereafter the resist is removed, and the substrate, e.g. the silicon wafer, is subjected to further known process steps, for example doping or metalization, to produce the desired component.

It is true that novolak positive resists have a higher etch stability, but they are unsuitable for exposure in the deep UV region (λ<300 nm) in the relevant film thickness range>0.5 μm, since the novolak matrix is excessively absorbant in the DUV region.

By contrast, the methacrylonitrile-containing copolymer according to the invention gives optimal exposure in the deep UV region and, compared with the customary polymethyl methacrylate DUV resist, is distinguished by increased stability in fluorine and chlorine-containing plasmas. It is therefore suitable in particular for use as a light-sensitive resist in the shortwave UV region (λ<300 nm).

In the Examples which follow, parts and percentages are by weight, unless otherwise stated. Parts by volume are to parts by weight as the liter is to the kilogram.

EXAMPLE 1

Preparing the polymers 14 parts of o-nitro-α-methylbenzyl methacrylate, 12 parts of methacrylic acid and 37 parts of methacrylonitrile are dissolved in 250 parts by volume of ethyl acetate. The solution is refluxed under nitrogen for 1 hour, and 1.23 parts of azobisisobutyronitrile are then added.

Refluxing is continued for a further 8 hours, and after cooling down the polymer is precipitated in 2,000 parts by volume of naphtha. Yield: 17.4 parts. To fractionate the polymer it is dissolved in 800 parts by volume of ethyl acetate, and 104 parts by volume of naphtha added dropwise until cloudiness persists. The solution is then heated until it is clear again, and finally the solution is cooled down, and an oily phase separates off. This is followed by decanting from the oily phase and precipitation in 800 parts by volume of naphtha. The polymer thus fractionated has a weight average of 64,200 g/mol and a nonuniformity of 1.6. Titration with KOH indicates a copolymerized methacrylic acid content of 18.1%. From UV measurements the o-nitro-α-methylbenzyl methacrylate content is found to be 28%. The glass transition temperature is 139° C.

Further polymers are prepared in a similar manner.

EXAMPLE 2

Preparation of resist structures

A solution of 25% by weight of polymer prepared in Example 1 in diethylene glycol dimethyl ether is filtered through a filter (pore diameter ca. 0.2 μm). About 2 ml of this solution are then dripped onto a silicon wafer. The wafer is spun at 2,000 r.p.m., producing a layer about 1 μm in thickness. After baking at 140° C. for about 10 minutes, the light-sensitive polymer layer is exposed with an excimer laser (λ=248 nm, KrF) through a structured mask. The contact material used is a quartz gray wedge mask of variable transmission, thereby exposing various areas of the light-sensitive layer to increasing amounts of light. The smallest amount of light which leads to stripping of the entire layer in the exposed areas is termed the sensitivity of the resist layer. The sensitivity depends on the strength of developer and for a 3% strength aqueous triethanolamine solution (containing 2% of butylglycol) is about 800 mJ/$cm^2$.

Under these conditions, then, the light-sensitive layer is exposed with the laser through a structured chromium mask for 25 seconds, developed with triethanolamine solution for 60 seconds and then dried. The resist structures thus produced are then used as a mask for transferring the resist pattern to $SiO_2$ by means of an $SF_6$ plasma.

EXAMPLE 3

Plasma etch stability

The etch experiments were carried out in a commercial parallel plate reactor from Plasma-Technology. The reactor comprises a vacuum system containing two electrodes in a parallel arrangement. The substrates to be etched are located on the lower, water-cooled, grounded electrode. To produce the plasma, the upper electrode is connected to a 13.56 MHz high frequency generator. Etching was carried out with 50 watts generator power and a gas pressure of 650 mTorr using $SF_6$ gas. The temperature of the cooled electrode during etching was 25° C. Oxidized wafers were spuncoated with a solution of the polymer in the particular suitable solvent in a thickness from 1 to 2 μm. To remove solvent residues, the wafers were baked at 160° C. for 30 minutes. Four wafers at a time were located on the lower electrode, the chamber was evacuated, etching gas was introduced and, after the pressure had stabilized, the plasma was ignited. The Layer thickness before and after each etching cycle is measured with a commercial α-step profilometer from Tencor Instruments. Comparative systems etched in the same process comprise commercially available novolak resist, polymethyl methacrylate and a further acrylate resist which contained methyl methacrylate instead of methacrylonitrile. Results are given in Table 1.

TABLE 1

| Etching weight of polymers in $SF_6$ plasma | |
|---|---|
| Polymer | Etching rate (A/min) |
| Novolak positive resist | 236 |
| Poly(oNMBMA$_{28}$-co-MAN$_{54}$-co-MAS$_{18}$)[a] (according to the invention) | 304 |
| Poly(oNMBMA$_{19}$-co-MMA$_{67}$[b]-co-MAS$_{14}$) | 417 |
| Poly(methyl methacrylate) | 469 |

[a] oNMBMA = o-nitro-α-methylbenzyl methacrylate
MAN = methacrylonitrile
MAS = methacrylic acid
[b] MMA = methyl methacrylate

We claim:

1. A copolymer which contains as copolymerized units (a) from 5 to 50 mol % of one or more compounds of the general formula (I)

$$\begin{array}{c} Y \\ | \\ C=O \\ | \\ O \\ | \\ X-C-H \\ | \\ \underset{\diagdown A \diagup}{C} \underset{}{\diagdown} \underset{C}{\diagup} NO_2 \end{array} \quad (I)$$

where
A is an aromatic or heteroaromatic, substituted or unsubstituted ring system of 5 to 14 ring members,
X is hydrogen, alkyl of 1 to 8 carbon atoms, or substituted or unsubstituted aryl or aralkyl, and
Y is an ethylenically unsaturated radical of 2 to 6 carbon atoms,
(b) from 94 to 30 mol % of methacrylonitrile,
(c) from 1 to 20 mol % of one or more olefinically unsaturated copolymerizable carboxylic acids of 3 to 6 carbon atoms,
(d) from 0 to 30 mol % of one or more further olefinically unsaturated, copolymerizable organic compounds other than (a), (b) and (c), whose homopolymers are transparent within the wavelength region from 250 to 400 nm, with the proviso that the percentages mentioned under (a) to (d) add up to 100.

2. A copolymer as defined in claim 1, wherein the radical Y in the general formula (I) is one of the radicals $$-CH=CH_2, \quad -\underset{CH_3}{\underset{|}{C}}=CH_2, \quad -CH=CH-COOH,$$

$$-CCl=CCl-COOH, \quad -\underset{CN}{\underset{|}{C}}=CH_2, \quad -CH=CHCH_3,$$

$$-\underset{\underset{CH_2}{\|}}{C}-CH_2-COOH, \quad -\underset{\underset{CH-COOH}{\|}}{C}-CH_3 \quad ,$$

-continued

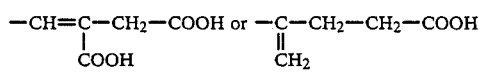

3. A copolymer as defined in claim 1, wherein in the general formula (I) the radical A is phenyl, the radical X is methyl and the radical Y is a

group.

4. A copolymer as defined in claim 1, which contains as component (c) copolymerized units of methacrylic acid.

5. A process for preparing a copolymer as defined in claim 1, which comprises polymerizing the compounds mentioned under (a) to (d) in the presence of a free radical initiator.

6. A photoresist which can be washed out with an aqueous alkaline solution, containing a copolymer as defined in claim 1.

7. A semiconductor component, which comprises a copolymer as defined in claim 1 as a light-sensitive material.

8. A light-sensitive coating material, which comprises a copolymer as defined in claim 1.

9. A dry resist, which comprises a copolymer as defined in claim 1.

10. A planographic printing plate, which comprises a copolymer as defined in claim 1.

11. A resist, which comprises a substrate and a copolymer as defined in claim 1.

* * * * *

UNITED STATES PATENT AND TRADEMARK OFFICE
CERTIFICATE OF CORRECTION

PATENT NO. : 4,822,866

DATED : April 18, 1989

INVENTOR(S) : SCHWALM et al.

It is certified that error appears in the above-identified patent and that said Letters Patent is hereby corrected as shown below:

ON THE TITLE PAGE INSERT:

[30] Foreign Application Priority Data
Jan. 21, 1987 Fed. Rep. of Germany .. 3701569

Signed and Sealed this

Second Day of January, 1990

Attest:

JEFFREY M. SAMUELS

*Attesting Officer*    *Acting Commissioner of Patents and Trademarks*